(12) United States Patent
Nozawa et al.

(10) Patent No.: US 6,902,330 B2
(45) Date of Patent: Jun. 7, 2005

(54) PRINTING PLATE PROCESSING APPARATUS

(75) Inventors: Ryoei Nozawa, Kanagawa (JP); Takayuki Iwamoto, Kanagawa (JP); Akinori Kimura, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 46 days.

(21) Appl. No.: 10/671,779

(22) Filed: Sep. 29, 2003

(65) Prior Publication Data
US 2004/0060466 A1 Apr. 1, 2004

(30) Foreign Application Priority Data

Sep. 30, 2002 (JP) .................................. 2002-288001

(51) Int. Cl.⁷ ................................................ G03D 3/08
(52) U.S. Cl. ...................... 396/602; 396/604; 396/612; 396/617; 396/620; 355/27
(58) Field of Search ............................... 396/602, 604, 396/612, 617, 620, 626; 355/27–29, 72

(56) References Cited

U.S. PATENT DOCUMENTS 4,931,378 A   6/1990   Hirano et al.

FOREIGN PATENT DOCUMENTS

| JP | 1-147454 A | 6/1989 |
|---|---|---|
| JP | 6-347975 A | 12/1994 |
| JP | 9-281683 A | 10/1997 |

Primary Examiner—D. Rutledge
(74) Attorney, Agent, or Firm—Sughrue Mion, PLLC

(57) ABSTRACT

A printing plate processing apparatus provides a step in which a printing plate which has undergone image exposure is processed by being immersed in a developing solution, and the printing plate is delivered while the developing solution is being squeezed out from the printing plate by a conveying roller pair which is partially immersed in the developing solution. A stoppage time of the apparatus is measured, and the conveying roller pair is driven to rotate for an amount of time set in accordance with a measured result of the stoppage time when operation of the apparatus is started, thereby allowing the conveying rollers to be cleaned. A concentration of carbon dioxide in an environment in which the apparatus is installed is detected, and based on the detected result and the measured result of the apparatus stoppage time, the driving time of the conveying roller pair is set.

18 Claims, 5 Drawing Sheets

PRINTING PLATE PROCESSING APPARATUS

CROSS REFERENCE TO RELATED APPLICATION

This application claims priority under 35 USC 119 from Japanese Patent Application No.2002-288001, the disclosure of which is incorporated by reference herein.

BACKGROUND OF THE INVENTION

1. Field of the Invention

The present invention relates to a printing plate processing apparatus in which a photosensitive planographic printing plate is processed with processing solutions.

2. Description of the Related Art

As a photosensitive material, photosensitive planographic printing plates (hereinafter referred to as "PS plates") comprising a photosensitive layer formed on an aluminum substrate or the like is used. In a PS plate processor which is a photosensitive material processing apparatus (printing plate processing apparatus) in which PS plates are processed, a plurality of processing steps which use processing solutions are provided: a developing step in which the PS plate is processed by being immersed in a developing solution; a washing step in which the PS plate is washed by spraying washing water onto the surface of the PS plate; a desensitizing step in which a desensitizing step is performed by coating the surface of the PS plate with a desensitizing solution such as a gum solution after the plate has finished the washing process; and the like. A PS plate which has undergone image exposure is thus subjected to developing, washing, and desensitizing processing, and the like in a processor such as this.

In the developing step of this PS plate processor, a printing plate is subjected to developing processing in such a manner as to be conveyed while being immersed in a developing solution stored in a developing tank. Further, the PS plate after it has finished the developing processing is nipped by a conveying roller pair provided at the most downstream side of the developing step and delivered to the subsequent washing step. At this time, in the PS plate processor, the PS plate is delivered to the washing step while the developing solution adhering to the surface of the PS plate is being squeezed out by the conveying roller pair.

In the conveying roller pair used to squeeze out the developing solution from the PS plate, a lower roller is partially immersed in the developing solution so as to prevent attached material on the surface of the PS plate from adhering to peripheral surfaces of the rollers and being transferred to the surface of a subsequent PS plate. In this type of conveying roller pair, a developing solution squeezed out from the PS plate, or a developing solution raised by the lower roller adheres to the peripheral surfaces of the rollers to form a solution film.

The developing solution used for processing of photosensitive material such as PS plates undergoes a deterioration in solution activity due to coming into contact with carbon dioxide ($CO_2$) in the air. For example, the developing solution used for developing processing of PS plates contains components for dissolving silicate material or binder material. Due to the component coming into contact with carbon dioxide, the ability thereof for dissolving silicate material or binder material deteriorates.

As a result, silicate material or binder material causes generation of crystallized material which is hard to dissolve. This crystallized material is also generated on a peripheral surface of a roller disposed outside the solution. That is, the developing solution adhering to the peripheral surface of the roller disposed outside the solution to form a solution film comes into contact with carbon dioxide in the air, thereby causing crystallized material generated by silicate material or binder material to appear as attached material on the peripheral surface of the roller. Further, the crystallized material increases as the amount of time that the developing solution comes into contact with carbon dioxide becomes longer.

The attached material on the roller is transferred to a PS plate which is to be subsequently processed, thereby exerting a great influence on the finished quality of a PS plate surface or on the printing performance.

In some photosensitive material processing apparatuses, a conveying roller pair is intermittently driven to rotate during a period in which photosensitive material is not processed, thereby causing surfaces of the rollers to be washed with a processing solution drawn by a lower roller (for example, see Japanese Patent Application Laid-Open (JP-A) No. 6-347975).

Further, in some of photosensitive material processing apparatuses, prior to processing of photosensitive material, a processing solution or processing solution component adhering to a peripheral surface of a lower roller disposed outside the solution in a conveying roller pair is washed off in such a manner as to be immersed in washing water, not in a processing solution such as a developing solution, or in such a manner that washing water is supplied to the peripheral surface of the roller (for example, see JP-A No. 9-281683).

However, in a case in which the rollers are merely driven to rotate intermittently, it is necessary to drive the rollers intermittently even when the operation of the apparatus stops. Further, in a case in which provision of a roller washing step in addition to a washing step by rollers is supposed, the structure of the developing step becomes complicated, and a developing solution in a developing tank is apt to come in contact with carbon dioxide in the air. Moreover, in a case in which the rollers are washed, the developing solution may be diluted due to the washing water.

The attached material on the roller adheres to a PS plate which has been processed first, and after the rollers make two or three revolutions, the attached material transferred to subsequent PS plates become diminished.

Accordingly, ordinarily, when the operation of a PS plate processor is started, a complicated operation is carried out in which a cleaning plate is inserted prior to insertion of a PS plate, and attached material adhering to the peripheral surface of a roller disposed outside the processing solution is transferred to the cleaning plate, or the like.

SUMMARY OF THE INVENTION

In view of the above-described circumstances, the present invention provides a printing plate processing apparatus which prevents, without effecting a roller washing operation or an operation using a cleaning plate, deterioration in the finished quality of a printing plate, which results from that attached material, which is produced due to a developing solution adhering to a peripheral surface of a roller and coming into contact with carbon dioxide in the air, being transferred to the surface of the printing plate.

A first aspect of the present invention is a printing plate processing apparatus in which a photosensitive printing plate which has undergone image exposure is subjected to developing processing by being immersed in a developing solution, comprising: a pair of conveying rollers which is driven to rotate in a state in which one of the rollers is partially immersed in the developing solution, thereby nipping and conveying the printing plate immersed in the developing solution; a measuring instrument which measures an amount of time that the pair of conveying rollers is in a stopped state; and a controller which controls a drive rotation of the pair of conveying rollers, wherein, when operation of the apparatus is started, said controller controls so as to drive the rotation of the pair of conveying rollers for a period of time, which is previously set in accordance with the measured amount of time, prior to developing processing.

The first aspect of the present invention can be applied to a printing plate processing apparatus in which a printing plate which has undergone image exposure is processed by being immersed in a developing solution and the printing plate is delivered while the developing solution is being squeezed out from the printing plate by the conveying roller pair in which a lower roller is partially immersed in the developing solution. This apparatus includes the measuring instrument which measures the stoppage time of the apparatus, and also includes the controller which, at the time of starting operation of the apparatus, drives the rotation of the conveying roller pair for cleaning for a period of time set in accordance with the measured result of the measuring instrument.

In accordance with the aforementioned aspect of the present invention, the period of time until the operation of the apparatus is restarted after the operation of the apparatus stops is measured by the measuring instrument. A cleaning controller sets the amount of time that the conveying roller pair is driven based on the measured result of the measuring instrument, and drives the rotation of the conveying roller pair for the set amount of time.

As a result, crystallized material generated in such a manner that a developing solution used to process, for example, a printing plate adheres to the peripheral surface of a roller disposed outside the solution and comes into contact with carbon dioxide in the air is washed off by a developing solution drawn by the lower roller, and is removed from the peripheral surface of the roller disposed outside the solution.

At this time, the amount of crystallized material generally increases in accordance with an amount of time that the developing solution comes into contact with carbon dioxide. That is, when the stoppage time of the apparatus becomes longer, the crystallized material generated on the peripheral surface of the conveying roller pair also increases. Further, in many cases, the period of time required for removal of crystallized material from the peripheral surfaces of the rollers, in a state of the conveying roller pair being driven to rotate, becomes longer as the amount of attached material increases.

For this reason, by setting the amount of time for cleaning during which the conveying roller pair is driven to rotate in accordance with the operation stoppage time of the apparatus, crystallized material can be efficiently and reliably removed from the peripheral surface of the conveying roller pair. Further, it is possible to reliably prevent the crystallized material from adhering to a printing plate to be processed first and having an adverse effect on the finished quality of a printing plate surface or the printing performance.

In the present invention, it is preferable that the setting section which sets the concentration of carbon dioxide in an environment in which the apparatus is installed is provided, and that the aforementioned cleaning controller sets the driving time of the conveying roller pair based on the setting section and the measured result of the measuring instrument.

Further, in the present invention, the setting section preferably includes a detector for detecting the concentration of carbon dioxide in the environment in which the apparatus is installed.

Fatigue of the developing solution caused by coming into contact with carbon dioxide in the air greatly varies depending on the concentration of carbon dioxide in the air. That is, when the concentration of carbon dioxide in the air is high, fatigue of the developing solution advances even over a short time, and crystallized material of silicate material or binder material is apt to be produced. When the concentration of carbon dioxide is low, the crystallized material is not apt to be produced.

For this reason, the concentration of carbon dioxide in the working environment is detected by the detector, and the conveying roller pair is driven to rotate for the amount of time set based on the concentration of carbon dioxide and the stoppage time of the apparatus. As a result, crystallized material generated on the peripheral surfaces of the rollers can be removed more efficiently and reliably.

The printing plate processing apparatus according to the first aspect is provided, in a preferred embodiment, so as to deliver a printing plate for a subsequent processing while the developing solution is being squeezed out from the printing plate by the pair of conveying rollers. Further, the measuring instrument comprises a timer.

In this embodiment, the printing plate processing apparatus includes the setting section for setting the driving time of the pair of conveying rollers corresponding to the measured result of the measuring instrument. The controller controls a drive rotation of the pair of conveying rollers for a period of the set amount of time. The setting section can set the driving time of the pair of conveying rollers in accordance with carbon dioxide concentration and the measured amount of time. Further, the detector which detects the concentration of carbon dioxide in the environment in which the apparatus is installed is provided, and based on the detected concentration of carbon dioxide and the measured time, the driving time of the pair of conveying rollers is determined. The setting section allows setting in which the cleaning plate is used in respective specific ranges of the carbon dioxide concentration and the measured amount of time.

In this embodiment, the setting section includes an operation panel for inputting a setting condition and a setting value of the driving time of the pair of conveying rollers, and a memory in which the inputted content is held. The setting condition includes an amount of time that the pair of conveying rollers has been in a stopped state at the time when the apparatus is required to start running. The setting condition also includes a concentration of carbon dioxide in an environment in which the apparatus is installed at the time when the apparatus is required to start running.

Further, in a case in which the amount of time that the pair of conveying rollers is in a stopped state is less than a predetermined value, the controller controls so as not to drive to rotate the pair of conveying rollers. The amount of time that the pair of conveying rollers is in a stopped state is the stoppage time of the apparatus. The driving time of the pair of conveying rollers is set so as to increase as the amount of time that the pair of conveying rollers is in a stopped state becomes greater.

Moreover, the driving time of the pair of conveying rollers is set so as to increase as a concentration of carbon dioxide in the environment in which the apparatus is installed becomes higher.

A second aspect of the present invention is a printing plate developing method in which a photosensitive printing plate which has undergone image exposure is subjected to developing processing by being immersed in a developing solution, said method comprising: providing a pair of conveying rollers for conveying the printing plate immersed in the developing solution configured to rotate in a state in which one of the rollers is partially immersed in the developing solution; setting an amount of time that the pair of conveying rollers is driven to rotate in accordance with an amount of time that the pair of conveying rollers is in a stopped state; measuring the amount of time that the pair of conveying rollers is in a stopped state; at the time at which operation of the apparatus is started, determining, based on said setting, an amount of time that the pair of conveying rollers is driven to rotate, which amount of time corresponds to the measured amount of time; and prior to start-up of developing processing, driving the rotation of the pair of conveying rollers for a period of the determined amount of time.

DETAILED DESCRIPTION OF THE INVENTION

[First Embodiment]

Figure 1:
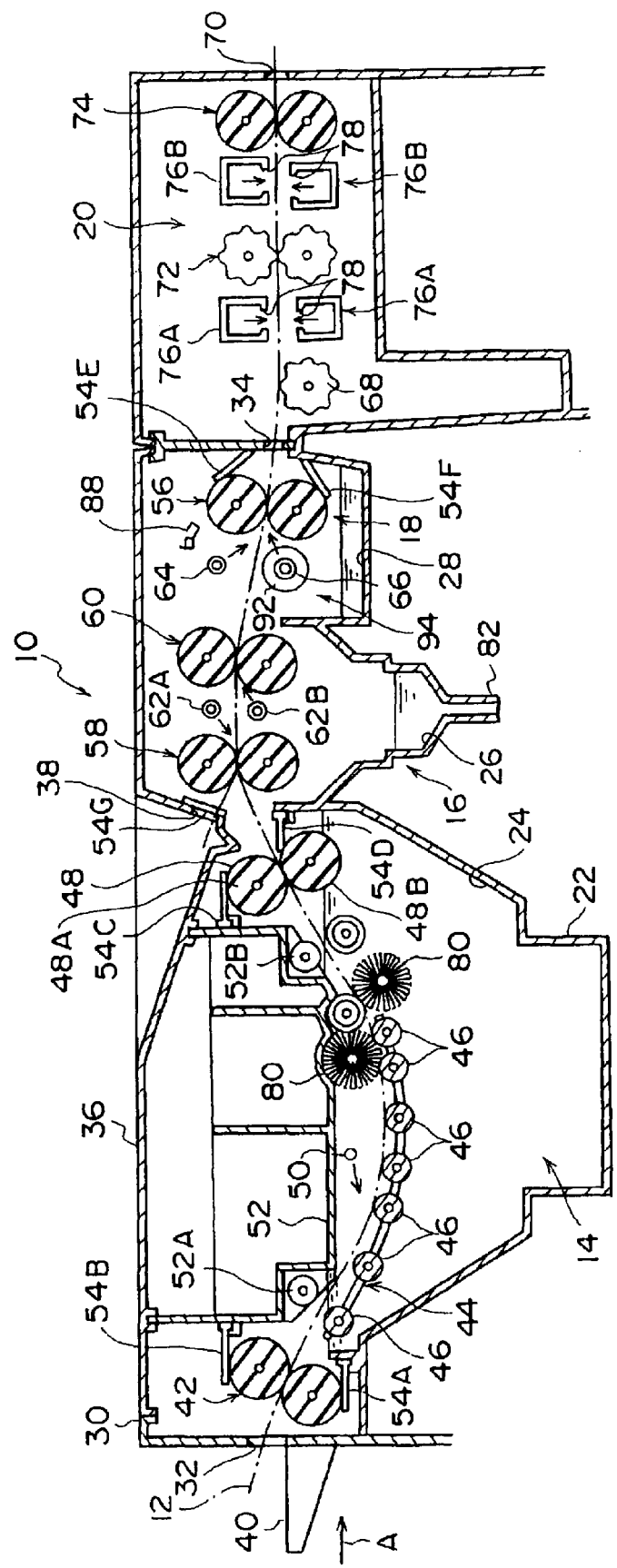
FIG. 1 is a schematic structural diagram of a PS plate processor applied to embodiments of the present invention.

An embodiment of the present invention will be described hereinafter with reference to the attached drawings. In FIG. 1, the structure of a printing plate developing apparatus (hereinafter referred to as a "PS plate processor 10") applied as an example of a processing plate processing apparatus is schematically shown. In the PS plate processor 10, developing processing for a photosensitive planographic printing plate (hereinafter referred to as a "PS plate 12") such as a photo-polymer plate which has undergone image exposure using an exposure device (not shown) is carried out.

The PS plate 12 is structured in such a manner that a photosensitive layer is formed on a substrate which is a thin-walled rectangular flat plate (for example, an aluminum substrate). A photo-polymer plate comprises photosensitive layers including a photo adhesion layer, a photo polymerization layer, and an overcoat layer superposed on one another, and polymerization reaction in an image portion of the photo polymerization layer is accelerated due to image exposure by laser beam.

The PS plate processor 10, which will be described below, allows processing of a large-size PS plate 12 which is about 1100 mm in width (in a direction orthogonal to the direction in which the PS plate is conveyed).

The PS plate processor 10 is provided with: a developing section 14 in which the PS plate 12 is processed using a developing solution; a washing section 16 in which the PS plate 12 after having been processed with the developing solution is washed with washing water; a desensitizing section in which the PS plate 12 after having been washed is subjected to desensitizing processing with a gum solution applied thereto; and a drying section 20 for drying the PS plate 12. That is, in the PS plate processor 10, a developing step, a washing step, a desensitizing step, and a drying step are sequentially provided along a direction in which the PS plate 12 is conveyed (along the direction indicated by arrow A in FIG. 1).

A processing tank 22 is provided in the PS plate processor 10. In the processing tank 22, a developing tank 24 is formed at a position corresponding to the developing section 14. A washing tank 26 and a desensitizing tank 28 are respectively formed at positions corresponding to the washing section 16 and the desensitizing section 18.

A slit-like insertion opening 32 is formed in an outer plate panel 30 which covers the processing tank 22, and a pass-through opening 34 is formed in the processing tank 22 at the side of the drying section 20.

The PS plate processor 10 is provided with a cover 36 which covers the upper side of the processing tank 22. The cover 36 is formed so as to cover the developing step, the washing step, and the desensitizing step, which are all provided in the processing tank 22, in an integrated manner. Further, an insertion opening (sub-insertion opening) 38 for re-entry of the PS plate 12 is provided in the cover 36 between the developing section 14 and the washing section 16. The sub-insertion opening 38 is used to insert the PS plate 12 to be processed in the PS plate processor 10, exclusive of processing in the developing section 14.

An insertion table 40 is provided outside the insertion opening 32, and a conveying roller pair 42 made of rubber is disposed in the developing section 14 at the side in which the PS plate 12 is inserted. The PS plate 12 with an image printed thereon is mounted on the insertion table 40 and inserted from the insertion opening 32 along the direction indicated by arrow A, and further, fed in between the conveying roller pair 42.

The conveying roller pair 42 are rotated by driving force from a driving system (not shown) to pull in the inserted PS plate 12, and conveys the PS plate 12 to the developing section 14 at an angle of about 15 to 31 degrees with respect to the horizontal direction. In the present embodiment, a singe-sided PS plate 12 having a photosensitive layer formed on one side of a substrate is used. The PS plate 12 is inserted from the insertion opening 32 into the PS plate processor 10 in a state in which the photosensitive layer is turned upward.

The developing tank 24 provided in the processing tank 22 is formed so as to have a substantially mountain-shaped configuration with a bottom-central portion thereof protruding downward. The developing solution used for developing processing of the PS plate 12 is stored in the developing tank 24. In the developing tank 24, a guide plate 44 is disposed at a lower side of a conveying path of the PS plate 12 along the bottom portion of the developing tank 24.

The guide plate 44 is provided at an upstream side of the developing tank 24 (at the side of the insertion opening 32), and a plurality of rollers (smaller rollers) 46 which freely rotate are mounted on the guide plate 44. The PS plate 12 fed into the developing section 14 by the conveying roller pair 42 is conveyed on the guide plate 44 while being guided by these rollers 46.

A conveying roller pair 48 whose outer peripheral portions are made of rubber is disposed in the developing tank 24 at the side of the washing section 16. The PS plate 12 guided and conveyed within the developing tank 24 substantially in the shape of U-shaped configuration is nipped by the conveying roller pair 48 and pulled out from the developing tank 24. When the PS plate 12 is thus conveyed in the developing tank 24, it is immersed in the developing solution, and an unnecessary portion of a photosensitive layer exposed to light by image exposure swells with the developing solution, and is removed from the substrate. As a result, an unnecessary photosensitive layer is removed in accordance with an exposure image.

A spray pipe 50 is provided in the developing tank 24, and the developing solution in the developing tank 24 sucked in by a pump (not shown) is sprayed by the spray pipe 50 onto the photosensitive layer surface of the PS plate 12 and supplied to the surface of the PS plate 12, and the developing solution in the developing tank 24 is made to circulate.

Further, brush rollers 80 are provided in the developing tank 24 between the guide plate 44 and the conveying roller pair 48. The brush rollers 80 are each adapted to rotate while causing a brush hair material to come into contact with the surface of the PS plate conveyed in a state of being immersed in the developing solution, so as to carry out brushing for the surface of the PS plate 12. As a result, removal of the unnecessary photosensitive layer from the surface of the PS plate 12 is promoted.

A solution-level lid 52 is disposed in the developing section 14 so that the lower surface thereof is positioned below the surface level of the developing solution stored in the developing tank 24. Further, shielding members 54A, 54B are provided on the wall surface of the developing tank 24 and in the solution-level lid 52 at the side of the insertion opening 32, and shielding members 54C, 54D are disposed at the side of the washing section 24. Shielding members 54E, 54F which abut on the peripheral surfaces of rollers in the conveying roller pair 56 are mounted at the processing tank 22 around the pass-through opening 34, and a shielding member 54G is mounted in the cover 36 at the sub-insertion opening 38.

These shielding members 54A, 54B, 54C, 54D, 54E, 54F, and 54G are each made of silicon rubber or the like. The solution-level lid 52 of a large capacity, which comes into contact with the surface of the developing solution, is provided in an enclosed space of the developing tank 24, which is formed by the shielding members 54A, 54B, 54C, 54D, 54E, 54F, and 54G, the conveying roller pairs 42, 48, and the like, thereby reducing the amount of the air trapped in this space. At the same time, outside fresh air can be prevented from coming in a region near the solution level of the developing solution due to the solution-level lid 52 and the shielding members 54A, 54B, 54C, 54D, 54E, 54F, and 54G, and deterioration of the developing solution due to carbon dioxide in the air and evaporation of water content is prevented. Skewer-like rollers 52A and 52B are provided on the lower surface of the solution-level lid 52 at both ends thereof at the upstream and downstream sides in the conveying direction of the PS plate 12, so as to prevent the surface (primarily, the photosensitive surface) of the PS plate 12 conveyed in the developing section 14 from being damaged resulting from coming into contact with the lower surface of the solution-level lid 52.

The PS plate 12 pulled out from the developing tank 24 by the conveying roller pair 48 is conveyed into the washing section 16. At this time, the conveying roller pair 48 is provided so as to squeeze out the developing solution adhering to both surfaces of the PS plate 12.

In the washing section 16, a conveying path is formed in which the PS plate 12 is conveyed by conveying roller pairs 58 and 60 disposed at the upper side of the washing tank 26 substantially in a horizontal state. The PS plate 12 is nipped by the conveying roller pairs 58 and 60 and conveyed horizontally at the upper side of the washing tank 26.

In the washing section 16, spray pipes 62A and 62B are disposed between the conveying roller pairs 58 and 60 with the conveying path of the PS plate 12 interposed therebetween, so as to form a pair on upper and lower sides of the conveying path. The spray pipes 62A and 62B are disposed so that axial directions thereof coincide with the transverse direction of the PS plate 12 (along a direction orthogonal to the conveying direction of the PS plate 12), and a plurality of discharge openings are formed on each of the sprays so as to face the conveying path of the PS plate 12.

Washing water is stored, as a processing solution, in the washing tank 26. Further, one end of a pipe 82 opens at the bottom of the washing tank 26. The spray pipes 62A and 62B are each connected to the pipe 82 via a supplying pump (not shown). The spray pipes 62A and 62B spray out washing water supplied by operating the supplying pump synchronously with conveying of the PS plate 12 from the discharge openings to the PS plate 12, thereby washing out the developing solution adhering to both surfaces (upper and lower surfaces) of the PS plate 12.

The developing solution washed off by washing water as described above falls in the washing tank 26 together with washing water. New washing water is supplied by a device (not shown) to the washing tank 26 in accordance with the amount of PS plates 12 to be processed. Further, due to the PS plate 12 being nipped and conveyed by the conveying roller pair 60, the washing water supplied to the PS plate 12 is squeezed out together with the developing solution adhering to the PS plate 12. Washing water from the spray pipe 62A is sprayed out in the opposite direction to the conveying direction of the PS plate 12, and washing water from the spray pipe 62B is sprayed out in the same direction as the conveying direction of the PS plate 12. However, the present invention is not limited to the same, and washing water from these spray pipes may also be sprayed out in other directions.

In the desensitizing section 18, a conveying roller pair 56 is disposed at the upper side of the desensitizing tank 28. The PS plate 12 is conveyed by the conveying roller pair 56 in the desensitizing section 18, and thereafter, fed into the drying section 20.

In the desensitizing section 18, spray pipes 64 and 66 which form a pair are disposed with the conveying path of the PS plate 12 interposed therebetween. Further, the desensitizing tank 28 is filled with a gum solution which serves as a desensitizing solution.

The gum solution in the desensitizing tank 28 is supplied to the spray pipes 64 and 66. The spray pipes 64 and 66 discharge the gum solution to, for example, a region between the upper and lower rollers of the conveying roller pair 56. As a result, the gum solution is supplied to both surfaces of the PS plate 12 which is being conveyed by the conveying roller pair 56.

When the PS plate 12 with the gum solution being supplied to both surfaces thereof is nipped and conveyed by the conveying roller pair 56, the conveying roller pair 56 allows the gum solution to be uniformly diffused entirely on both surfaces of the PS plate 12, and squeezes out excess gum solution from the PS plate 12.

As a result, the PS plate 12 is delivered by the conveying roller pair 56 while a thin film of gum solution for protection of a printing surface is being formed thereon. A plurality of rollers 92 are provided in the spray pipe 66 at predetermined intervals, thereby forming a guide roller 94 which supports a trailing end of the PS plate 12. Further, an arbitrary structure can be applied in which a gum solution discharging unit having a slit-like discharge opening formed therein is provided in place of the spray pipe 66, and the PS plate 12 is conveyed while coming into contact with the gum solution sprayed out from the discharging unit, thereby allowing the gum solution to be applied to the lower surface of the PS plate 12.

The PS plate 12 delivered by the conveying roller pair 56 while a thin film of gum solution is being formed thereon, is delivered into the drying section 20 from the pass-through opening 34.

In the drying section 20, a supporting roller 68 which supports the PS plate 12 is disposed in the vicinity of the pass-through opening 34. A conveying roller pair 72 is disposed at an intermediate portion of the PS plate 12 conveying path in the drying section 20 and a conveying roller pair 74 is disposed in the vicinity of an ejection opening 70. The PS plate 12 is conveyed by the supporting roller 68 and the conveying roller pairs 72 and 74 in the drying section 20.

A pair of ducts 76A are disposed between the supporting roller 68 and the conveying roller pair 72 with the conveying path of the PS plate 12 interposed therebetween, and a pair of ducts 76B are disposed between the conveying roller pairs 72 and 74 with the conveying path of the PS plate 12 interposed therebetween. The pairs of ducts 76A and 76B are disposed such that the longitudinal direction thereof coincides with the transverse direction of the PS plate 12. A slit hole 78 is formed on a surface of each duct, which faces the conveying path of the PS plate 12.

When dry air generated by a dry air generating section (not shown) is supplied from a longitudinal-direction one end of each of the ducts 76A and 76B, the dry air is discharged from the slit hole 78 to the conveying path of the PS plate 12 and blown against the PS plate 12. As a result, the gum solution applied to both surfaces of the PS plate 12 is dried and a protective film is formed on the PS plate 12. The pass-through opening 34 is provided with a shutter (not shown) which separates the processor section up to the desensitizing section 18, in which the PS plate 12 is processed with the processing solutions, and the drying section 20 from each other. The shutter prevents heated air in the drying section 20 from coming in the desensitizing section 18, resulting from the pass-through opening 34 being inadvertently opened.

The conveying roller pair 48 provided in the developing section 14 of the PS plate processor 10 is formed by an upper roller 48A and a lower roller 48B. The upper roller 48A and an upper portion of the lower roller 48B are disposed above the level of the developing solution, and a lower portion of the lower roller 48B is immersed in the developing solution.

The developing solution squeezed out from both surfaces of the PS plate 12 is washed off by the developing solution drawn by the lower roller 48B, and the surfaces of the rollers 48A and 48B are kept clean.

Figure 2:
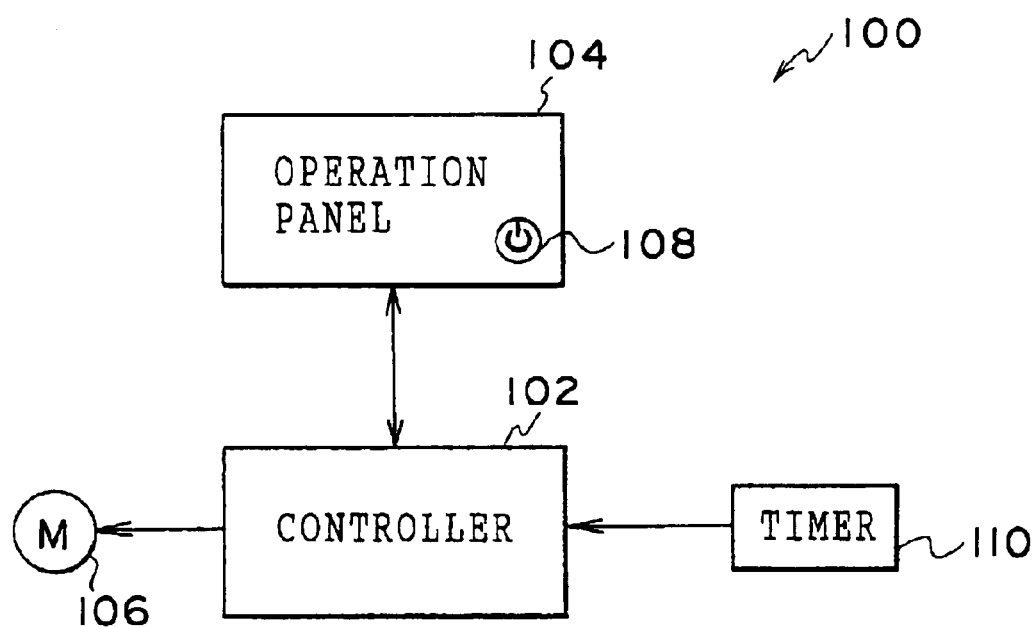
FIG. 2 is a block diagram which schematically shows a principal portion of a control section applied to a first embodiment of the present invention.

As is shown in FIG. 2, a conveying motor 106 which drives the rotation of the insertion roller pair 42, and also the conveying roller pairs 48, 56, 58, 60, 72, and 74 is connected to a controller 102 of a control section 100 which controls operation of the PS plate processor 10. The controller 102 operates the conveying motor 106 at a predetermined timing so as to convey the PS plate 12 inserted from the insertion opening 32. Various driving devices, a heating device, and various sensors provided in the PS plate processor 10 are each connected to the controller 102, but in the present embodiment, detailed illustration and description thereof will be omitted.

An operation panel 104 provided at an upper side of the processor is connected to the controller 102. The operation panel 104 is provided with a power switch 108 which controls on-off operation of the processor. Due to the power switch 108 being turned on, the controller 102 is built up so as to allow the PS plate 12 to be most suitably processed. Further, the PS plate processor 10 stops running due to an off operation of the power switch 108.

Further, a timer 110 serving as a measuring section which measures an operation stoppage time of the processor, or the like is connected to the controller 102. The controller 102 is provided so as to measure the operation stoppage time of the processor using the timer 110.

Silicate material or binder material contained in the developing solution is crystallized, and is apt to adhere, as attached material, to the peripheral surfaces of the rollers 48A and 48B in the conveying roller pair 48 provided in the developing tank 24, which peripheral surfaces are exposed from the developing solution.

When the controller 102 starts build-up of the PS plate processor 10 by turning on the power switch 108, it reads in the operation stoppage time of the processor measured by the timer 110, and in accordance with the operation stoppage time, drives the conveying motor 106 so as to rotate the conveying roller pair 48, thereby allowing roller cleaning in which attached material adhering to the peripheral surface of the roller 48B and the peripheral surface of the roller 48A is removed by the developing solution drawn by the roller 48B.

In the controller 102, in addition to the roller cleaning by the conveying roller pair 48, removal of a solidified gum solution component adhering to the peripheral surface of the conveying roller pair 56 provided in the desensitizing section 18, and the like are concurrently carried out.

As is shown in FIG. 1, a watershoot-like rectifier plate 88 is provided above the conveying roller pair 56. The rectifier plate 88 is disposed so that the longitudinal direction thereof coincides with the axial direction of the conveying roller pair 56, and water used to dilute gum solution is supplied by a water supplying system (not shown).

Further, a plurality of through holes (not shown) are formed on the rectifier plate 88 so as to face the peripheral surface of the upper roller, and water supplied from the water supplying system is supplied to the peripheral surface of the upper roller in the conveying roller pair 56 while being diffused in the axial direction. At this time, due to the conveying roller pair 56 being driven to rotate, the peripheral surfaces of the upper and lower rollers in the conveying roller pair 56 are washed by the water to allow a gum solution component adhering to the roller peripheral surfaces to be washed off.

The washing mechanism of the conveying roller pair 56 is not limited to the above. For example, a conventionally-known washing mechanism can be applied in which a washing roller which rotates while coming into contact with a peripheral surface of an upper roller is used, and the conveying roller pair 56 is driven to rotate while water is being supplied to a region in which the washing roller and the upper roller come into contact with each other, thereby washing the peripheral surfaces of the rollers.

In the PS plate processor 10 structured in this manner, when the PS plate 12 with an image being recorded by an exposure device (not shown) is mounted on the insertion table 40 and inserted in the insertion opening 32, the PS plate 12 is pulled in by the conveying roller pair 42 and conveyed into the developing section 14. In the PS plate processor 10, when the PS plate 12 passing through the insertion opening 32 is detected by a sensor (not shown), a timer is started. This timer is used to measure a timing at which washing water is discharged from the spray pipes 62A and 62B in the washing section 16 and a timing at which gum solution is discharged in the desensitizing section 18, along with the operation of a driving device for conveying the PS plate 12.

The PS plate 12 is delivered into the developing section 14 by the conveying roller pair 42 at an insertion angle in the range of 15 to 31 degrees with respect to the horizontal direction, and is conveyed while being immersed in the developing solution. Further, the PS plate 12 is delivered out from the developing solution at an emission angle in the range of 17 to 31 degrees. Due to the PS plate 12 being immersed in the developing solution in the developing section 14, an unnecessary portion of the photosensitive layer swells in accordance with an exposure image, and the swollen photosensitive layer is removed from the substrate. At this time, the surface of the PS plate 12 is brushed by the brush rollers 80 disposed in the developing tank 24, thereby expediting removal of the unnecessary photosensitive layer from the surface of the PS plate 12.

In the PS plate processor 10, a plurality of bush rollers 80 may be adapted to effect brushing in a state of being disposed to face the surface of the PS plate 12, or the PS plate 12 may be subjected to such processing without using the brush rollers 80.

The PS plate 12 delivered out of the developing solution after having been processed with the developing solution is pulled out by the conveying roller pair 48, and conveyed to the washing section 16 while the developing solution adhering to both surfaces of the PS plate 12 is being squeezed out.

In the washing section 16, washing water is sprayed out from the spray pipes 62A and 62B while the PS plate 12 is being nipped and conveyed by the conveying roller pairs 58 and 60 substantially in a horizontal state. Further, the conveying roller pair 60 disposed at the downstream side in the conveying direction of the PS plate 12 is provided so as to squeeze out, from both surfaces of the PS plate 12, washing water supplied to both surfaces of the PS plate 12 together with remaining developing solution which has not been completely squeezed out by the conveying roller pair 48, and at the same time, deliver out the PS plate 12 to the desensitizing section 18. As a result, the PS plate 12 is delivered out to the desensitizing section 18 in a state in which the developing solution does not adhere to the upper and lower surfaces of the PS plate 12.

The PS plate 12 conveyed to the desensitizing section 18 passes through between the spray pipe 64 and the discharge unit 66, and thereafter, it is nipped by the conveying roller pair 56.

At this time, in the desensitizing section 18, the gum solution is supplied to the spray pipes 64 and 66 and applied to the upper and lower surfaces of the PS plate 12. Due to the conveying roller pair 56 nipping and delivering out the PS plate 12, the thin film of gum solution is formed on each of the upper and lower surfaces of the PS plate 12, and excess gum solution is squeezed out from the both surfaces of the PS plate 12. The PS plate 12 with the gum solution applied thereto is delivered into the drying section 20 from the pass-through opening 34.

There may also be applied a structure in which a shutter is provided at the pass-through opening 34, and the pass-through opening 34 is opened at a timing at which processing of the PS plate 12 is started, or a timing at which the PS plate 12 is delivered out from the desensitizing section 18, thereby allowing the PS plate 12 to be delivered out to the drying section 20. As a result, it is possible to prevent the gum solution from being fixed to the conveying roller pair 56, resulting from dry air from the drying section 20 inadvertently coming into the desensitizing section 18, and it is also possible to prevent deterioration of the developing solution due to carbon dioxide in the air which comes into the developing section 14 from the pass-through opening 34, and further prevent water content in the developing solution, washing water, and water content in the gum solution from coming out from the pass-through opening 34 due to evaporation thereof. These improvements are desired.

In the drying section 20, dry air from the ducts 76A and 76B is blown against the PS plate 12 while the PS plate 12 is being conveyed by the supporting roller 68 and the conveying roller pairs 72 and 74. As a result, a protective film is formed by the gum solution applied to the PS plate 12, and the PS plate 12 with this protective film formed thereon is discharged from the ejection opening 70.

In the PS plate processor, the gum solution adheres to and remains on the peripheral surface of the conveying roller pair 56 after the PS plate 12 has been processed, and the developing solution adheres to the peripheral surfaces of the upper and lower rollers 48A, 48B in the conveying roller pair 48 to form a thin film thereon. At this time, when the controller 102 provided in the PS plate processor 10 stops operation of the processor due to the power switch 108 being turned off, the controller 102 drives the conveying motor 106 while supplying water to the rectifier plate 88 provided in the desensitizing section 18, thereby carrying out washing for the peripheral surface of the conveying roller pair 56. Further, when the power switch 108 is turned on to start operation of the processor, the controller 102 drives the conveying motor 106 while supplying water to the rectifier plate 88, so as to carry out washing of the conveying roller pair 56. As a result, a solidified portion of remaining gum solution, which cannot be removed from the peripheral surfaces of the conveying roller pair 56 at the operation stoppage time of the processor, is dissolved and removed from the peripheral surfaces of the conveying roller pair 56 at the operation stoppage time of the processor.

The developing solution in the developing tank 24 provided in the PS plate processor 10 becomes fatigued due to coming into contact with carbon dioxide in the air, and silicate material or binder material is apt to be crystallized.

Further, the developing solution adheres to the peripheral surfaces of the rollers in the conveying roller pair 48 provided in the developing tank 24, which peripheral surfaces are exposed from the level of the developing solution. Due to the peripheral surfaces of the rollers (the rollers 48A and 48B) in the conveying roller pair 48 coming into contact with carbon dioxide in the air at the operation stoppage time of the processor, silicate material or binder material contained in the developing solution ends up being crystallized. Moreover, when the amount of time that the processor stops running increases and the developing solution comes into contact with the air for a longer period of time, the amount of attached material crystallized on the peripheral surfaces of the rollers 48A and 48B also increases.

When the controller 102 starts operation of the processor by turning on the power switch 108 of the PS plate processor 10, the controller 102 activates the conveying motor 106 in accordance with the operation stoppage time of the processor, thereby driving the rotation of the conveying roller pair 48. As a result, the developing solution in the developing tank 24 is drawn by the roller 48B and is used to effect cleaning for the peripheral surfaces of the rollers 48A and 48B. In this way, removal of attached material on the peripheral surfaces of the rollers 48A and 48B is achieved.

Figure 3:
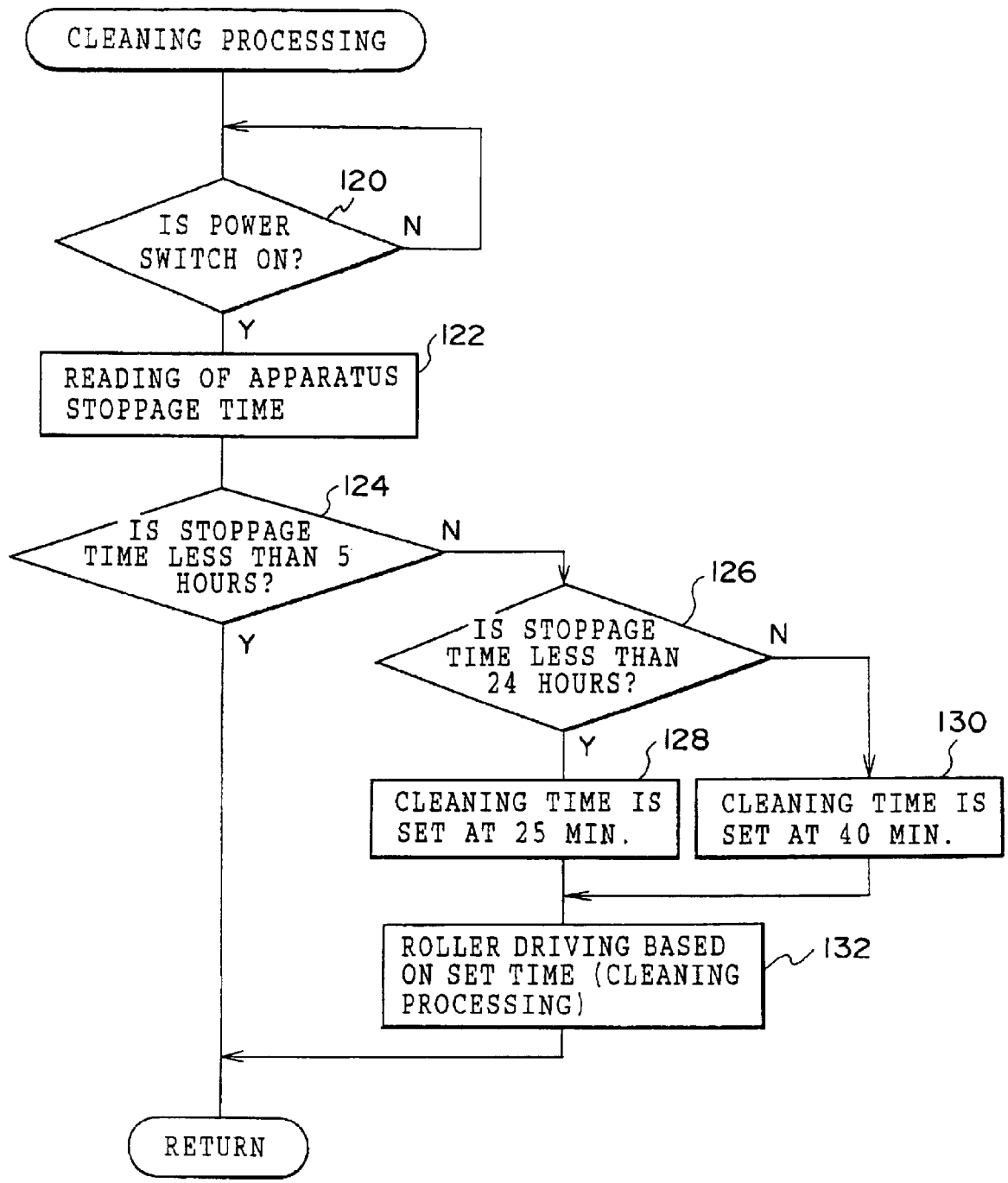
FIG. 3 is a flow chart which schematically shows cleaning processing according to the first embodiment of the present invention.

Next, cleaning processing for the conveying roller pair 48 in the first embodiment will be described with reference to the flow chart shown in FIG. 3. The controller 102 allows presetting of the operating time of the conveying motor 106 with respect to the operation stoppage time of the processor when cleaning of the conveying roller pair 48 is effected, and stores this setting in memory (not shown).

This flow chart is executed concurrently with build-up processing of the PS plate processor 10 in which the power switch 108 of the PS plate processor 10 is turned on. At the initial step 120, it is confirmed whether the power switch 108 has been turned on or not. When it is confirmed that the power switch 108 has been turned on, the process passes to step 122.

At step 122, the operation stoppage time of the processor measured by the timer 110 is read in. Thereafter, at step 124, based on the operation stoppage time of the processor, the operating time of the conveying motor 106, that is, a cleaning time in which the conveying roller pair 48 is driven to rotate is set.

When the operation stoppage time of the processor is short, for example, less than five hours, and it is determined that no attached material (crystallized silicate material or binder material) adheres to the peripheral surfaces of the rollers 48A and 48B, the decision of step 126 is made affirmative, and the process ends without effecting the operation of the conveying motor 106 for cleaning the conveying roller pair 48. In the PS plate processor 10, even if cleaning of the conveying roller pair 48 is not effected, so long as cleaning of the conveying roller pair 56, or the like is required, the conveying motor 106 is adapted to operate.

To the contrary, when the operation stoppage time of the processor is five hours or more, the decision of step 124 is made negative, and the process passes to step 126. At step 126, it is confirmed whether the operation stoppage time of the processor is less than 24 hours or not. That is, at step 126, it is confirmed whether the operation stoppage time of the processor is five hours or more and is also less than 24 hours.

When the operation stoppage time of the processor is five hours or more and is also less than 24 hours, the decision of step 126 is made affirmative, and the process passes to step 128 in which the operating time (cleaning time) of the conveying motor 106 is set at 25 minutes.

To the contrary, when the operation stoppage time of the processor is 24 hours or more, the decision of step 126 is made negative and the process passes to step 130 in which the cleaning time is set at 40 minutes.

In this way, when the cleaning time is set based on the operation stoppage time of the processor, the process passes to step 132 in which the conveying motor 106 is made to operate during the set cleaning time to drive the rotation of the conveying roller pair 48.

As a result, the developing solution in the developing tank 24 is drawn by the lower roller 48B of the conveying roller pair 48 to allow washing of the peripheral surfaces of the rollers 48A and 48B, thereby resulting in attached material on the peripheral surfaces of the rollers 48A and 48B being washed off.

By setting, based on the operation stoppage time of the processor, the cleaning time for which the conveying roller pair 48 is driven to rotate, there is no possibility that though the operation stoppage time of the processor is short and no attached material adheres to the rollers 48A and 48B, cleaning is inadvertently effected, or that though the operation stoppage time of the processor is long and large quantities of attached material adhere to the rollers 48A and 48B, the attached material cannot be completely removed and ends up remaining due to a short cleaning time.

That is, the attached material on the rollers 48A and 48B, resulting from the developing solution coming into contact with carbon dioxide in the air, increases in amount when the operation stoppage time of the processor becomes longer and the attached material comes into contact with the air for a longer time. Further, the attached material decreases in accordance with the period of time in which the rollers 48A and 48B are driven to rotate.

Accordingly, when the amount of the attached material is small, the cleaning time in which the rollers 48A and 48B are driven to rotate does not need to be made longer. However, when the amount of the attached material is large, the cleaning time needs to be made longer.

In the PS plate processor 10, due to the cleaning time being set in accordance with the operation stoppage time, efficient and reliable cleaning is effected. As a result, the PS plates 12 including a PS plate to be processed first can be finished into high-quality ones having no attached material adhering thereto, without effecting an operation in which, for example, a cleaning plate is inserted from the insertion opening 32 and the attached material on the peripheral surfaces of the rollers 48A and 48B are made to adhere to the cleaning plate.

Note that the operation stoppage time of the processor and the cleaning time set based on the operation stoppage time, which are applied to the first embodiment, are merely exemplary. If only the rollers 48A and 48B can be suitably cleaned, an arbitrary setting time can be used.

[Second Embodiment]

Next, a second embodiment of the present invention will be described. Note that a basic structure of the second embodiment is the same as that of the aforementioned first embodiment, and the same members as those of the first embodiment will be denoted by the same reference numerals, and a description thereof will be omitted.

Figure 4:
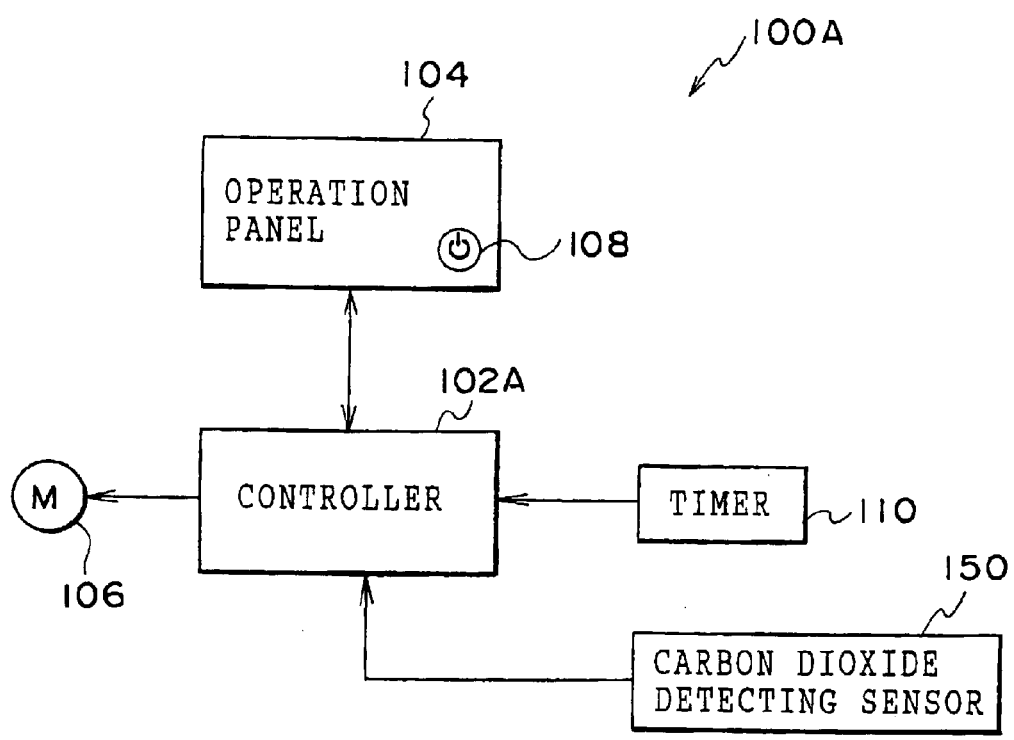
FIG. 4 is a block diagram which schematically shows a principal portion of a control section applied to a second embodiment of the present invention.

In FIG. 4, the structure of a control section 100A according to the second embodiment of the present invention is schematically shown. In the control section 100A, a carbon dioxide detecting sensor 150 for detecting carbon dioxide in an environment in which the PS plate processor 10 is installed is provided. The carbon dioxide detecting sensor 150 is connected to a controller 102A.

The controller 102A is provided so as to set the cleaning time of the conveying roller pair 48 (that is, the operating time of the conveying motor 106) based on the operation stoppage time of the processor measured by the timer 110 and the concentration of carbon dioxide in the air detected by the carbon dioxide detecting sensor 150.

At this time, the driving time of the conveying roller pair 48 with respect to the operation stoppage time of the processor is set in memory (not shown) provided in the controller 102A, and an example thereof is shown in Table 1.

TABLE 1

Driving time of conveying roller pair

| operation stoppage time of processor | carbon dioxide concentration in setting environment | | |
|---|---|---|---|
| | Less than 500 ppm | 500 ppm to 1200 ppm | 1200 ppm to 2000 ppm |
| less than 5 hours | 0 min. | 0 min. | 0 min. |
| 5 to 24 hours | 5 min. | 10 min. | 25 min. |
| 24 to 48 hours | 25 min. | 30 min. | 40 min. |
| 48 to 72 hours | 40 min. | cleaning plate used | cleaning plate used |
| more than 72 hours | Cleaning plate used | cleaning plate used | cleaning plate used |

The controller 102A is provided so as to effect cleaning of the conveying roller pair 48 based on the aforementioned setting. In the second embodiment, when the cleaning time becomes longer based on the prediction that a large quantity of attached material may adhere to the rollers 48A and 48B, cleaning processing using the cleaning plate is required without effecting cleaning processing in which the conveying motor 106 is activated to make the conveying roller pair 48 to run idle. The cleaning processing using the cleaning plate is provided so as to require an operator to carry out the processing in such a manner as to be shown in a display section (not shown) provided in the operation panel 104.

Figure 5:
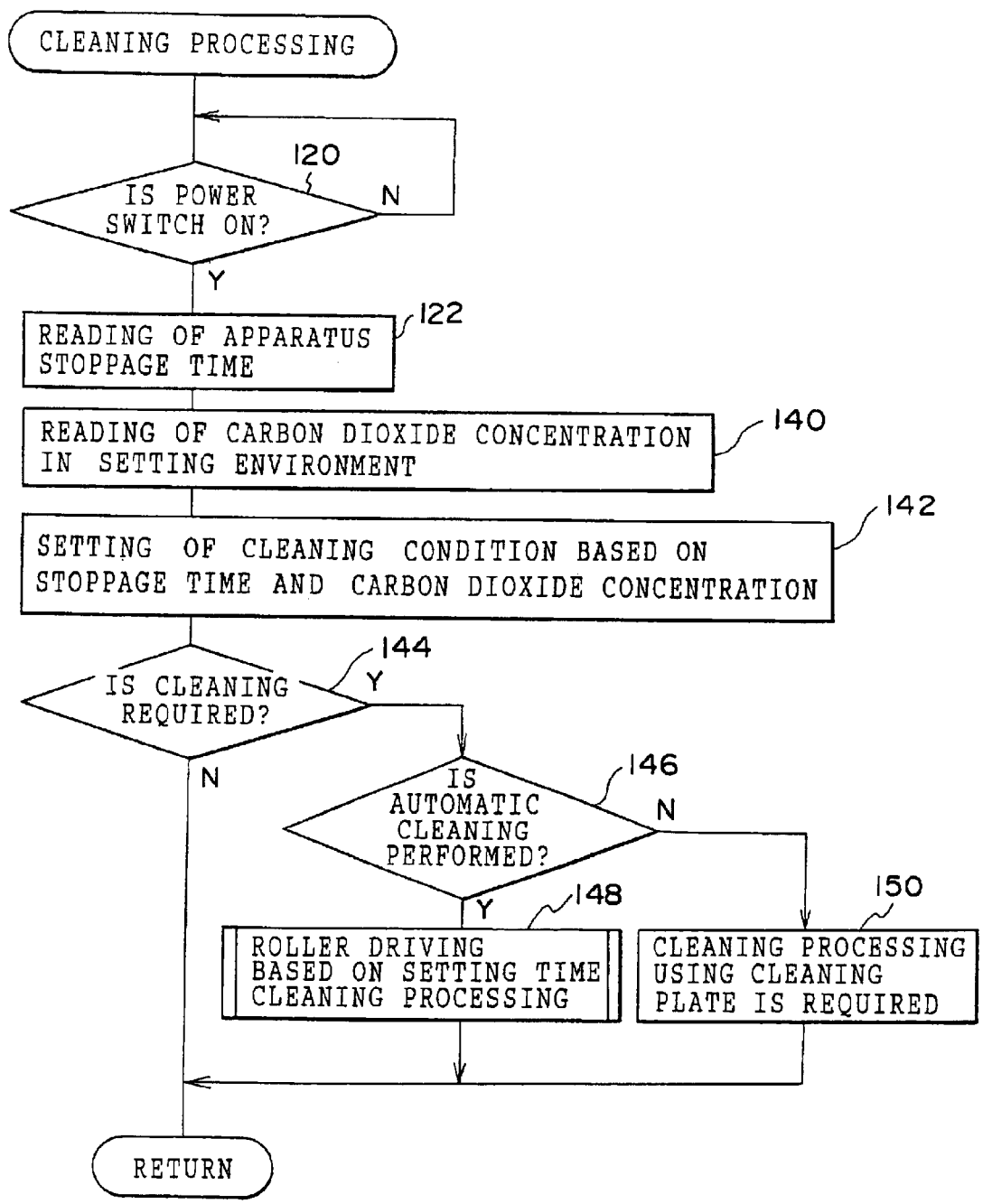
FIG. 5 is a flow chart which schematically shows cleaning processing according to the second embodiment of the present invention.

In FIG. 5, cleaning processing according to the second embodiment is schematically shown.

In this flow chart shown in FIG. 5, when the power switch 108 is operated to turn on the PS plate processor 10, the process passes to step 122 at which the operation stoppage time of the processor measured by the timer 110 is read in. At the subsequent step 140, the concentration of carbon dioxide detected by the carbon dioxide detecting sensor 150 is read in.

Thereafter, at step 142, based on the operation stoppage time of the processor, the concentration of carbon dioxide, and the setting shown in Table 1, the driving time of the conveying roller pair 48 (the operating time of the conveying motor 106) is set.

For example, if the operation stoppage time of the processor is less than five hours, it is determined that no attached material is present on the peripheral surfaces of the rollers 48A and 48B irrespective of the concentration of carbon dioxide in the air, and the cleaning processing ends.

When the operation stoppage time of the processor is five hours or more, the cleaning time is set based on the operation stoppage time and the concentration of carbon dioxide. At this time, when the concentration of carbon dioxide in the air is low, the amount of attached material is predicted to be small. Therefore, the cleaning time is set to be short. When the concentration of carbon dioxide in the air is high, the amount of attached material is predicted to be large. Therefore, the cleaning time is set to be long.

To the contrary, when the operation stoppage time of the processor is extremely long or when the concentration of carbon dioxide in the air is extremely high, a large quantity of attached material is produced. When it is determined that a longer period of time is required so as to completely remove the attached material by making the conveying roller pair 48 to run idle, the cleaning processing using the cleaning plate is set as being required.

When the cleaning processing is thus set, the decision of step 144 is made negative and the process passes to step 146. At step 146, it is confirmed whether automatic cleaning in which the conveying roller pair 48 is made to run idle without using the cleaning plate is set or not.

In other words, it is determined whether, based on the operation stoppage time of the processor and the concentration of carbon dioxide, the driving time of the conveying roller pair 48 is set or not. When the driving time is set, the decision of step 146 is made affirmative, and the process passes to step 148 at which based on the setting time, the conveying motor 106 is driven to allow cleaning processing of the conveying roller pair 48.

To the contrary, when processing using the cleaning plate is set, the decision of step 146 is made negative, and the process passes to step 150 at which cleaning processing using the cleaning plate is required.

Fatigue of the developing solution is greatly affected by the concentration of carbon dioxide in the air, in addition to the stoppage time. As the concentration of carbon dioxide increases, crystallization of silicate material or binder material makes progress.

For this reason, in the second embodiment, due to the driving time of the conveying roller pair 48 being set based on the concentration of carbon dioxide in the air in addition to the operation stoppage time of the processor, removal of the attached material on the rollers 48A and 48B can be more reliably and efficiently achieved.

In the present embodiment, the driving time of the conveying roller pair 48 (that is, the cleaning time) is set by detecting the concentration of carbon dioxide in an environment in which the processor is installed by means of the carbon dioxide detecting sensor 150. However, the present invention is not limited to the same. There may also be used a structure in which the concentration of carbon dioxide in an environment in which the processor is installed, which concentration is predicted or detected by a carbon dioxide detecting sensor provided separately, is previously inputted by a key operation from the operation panel 104, and based on the inputted concentration of carbon dioxide and the operation stoppage time of the processor, the cleaning time of the conveying roller pair 48 is set.

The concentration of carbon dioxide in the air varies according to seasons, for example, depending on whether heating equipment is used or not. Further, the concentration can be predicted based on a determination as to whether the processor is installed in an environment which is high in carbon dioxide or an environment which is low in carbon dioxide. Moreover, so long as environmental conditions do not greatly change, the change in the concentration can be assumed to be small.

Accordingly, it is also possible to previously set the concentration of carbon dioxide. As a result, suitable cleaning of the conveying roller pair 48 becomes possible without using an expensive carbon dioxide detecting sensor 150.

In the second embodiment as well, the operation stoppage time of the processor and the concentration of carbon dioxide shown in Table 1 shown above, and the driving time of the conveying roller pair 48 based thereon are merely exemplary. So long as suitable and reliable cleaning of the conveying roller pair 48 is made possible, the operation stoppage time, concentration, and driving time each can be arbitrarily set.

Further, in the aforementioned embodiments, the PS plate processor 10 for processing the PS plate 12 was described as an example, but the present invention is not limited to the PS plate processor 10 and can be applied to a printing plate developing apparatus having an arbitrary structure in which a printing plate such as the PS plate 12 is processed by being immersed in the developing solution.

As described above, the present invention is provided so as to set a driving time of a roller which is partially exposed from a processing solution based on at least an operation stoppage time of the processor, and based on the set driving time, drive this roller. Accordingly, an excellent effect is obtained in which attached material on the peripheral surface of the roller can be efficiently and reliably removed.

What is claimed is:

1. A printing plate processing apparatus in which a photosensitive printing plate which has undergone image exposure is subjected to developing processing by being immersed in a developing solution, comprising:

a pair of conveying rollers which is driven to rotate in a state in which one of the rollers is partially immersed in the developing solution, thereby nipping and conveying the printing plate immersed in the developing solution;

a measuring instrument which measures an amount of time that the pair of conveying rollers is in a stopped state; and a controller which controls a drive rotation of the pair of conveying rollers, wherein, when operation of the apparatus is started, said controller controls so as to drive the rotation of the pair of conveying rollers for a period of time, which is previously set in accordance with the measured amount of time, prior to developing processing.

2. The apparatus of claim 1, wherein said pair of conveying rollers is disposed so as to deliver the printing plate for subsequent processing while squeezing out the developing solution from the printing plate.

3. The apparatus of claim 1, wherein said measuring instrument comprises a timer.

4. The apparatus of claim 1, further comprising a setting section for setting a driving time of the pair of conveying rollers corresponding to the measured time, wherein said controller controls a drive rotation of the pair of conveying rollers for a period of the time set by the setting section.

5. The apparatus of claim 4, wherein said setting section can set the driving time of the pair of conveying rollers in accordance with carbon dioxide concentration and the measured time.

6. The apparatus of claim 5, further comprising a detector for detecting a concentration of carbon dioxide in an environment in which the apparatus is installed, wherein the driving time of the pair of conveying rollers is determined based on the detected carbon dioxide concentration and the measured time.

7. The apparatus of claim 5, wherein said setting section makes a setting such that a cleaning plate is used in respective specified ranges of the carbon dioxide concentration and the measured time.

8. The apparatus of claim 4, wherein said setting section is provided with an operation panel for inputting a setting condition and a setting value of the driving time of the pair of conveying rollers, and a memory in which the inputted content is held.

9. The apparatus of claim 8, wherein the setting condition includes an amount of time that the pair of conveying rollers has been in a stopped state at the time at which an instruction for start-up of operation is given to the apparatus.

10. The apparatus of claim 8, wherein the setting condition includes a concentration of carbon dioxide in an environment in which the apparatus is installed at the time at which an instruction for start-up of operation is given to the apparatus.

11. The apparatus of claim 1, wherein said controller controls so as not to drive the rotation of the pair of conveying rollers in a case in which the amount of time that the pair of conveying rollers is in a stopped state is less than a predetermined value.

12. The apparatus of claim 1, wherein the amount of time that the pair of conveying rollers is in a stopped state is a stoppage time of the apparatus.

13. The apparatus of claim 1, wherein the driving time of the pair of conveying rollers is set so as to increase as the amount of time that the pair of conveying rollers is in a stopped state becomes greater.

14. The apparatus of claim 1, wherein the driving time of the pair of conveying rollers is set so as to increase as a concentration of carbon dioxide in an environment in which the apparatus is installed becomes higher.

15. A printing plate developing method in which a photosensitive printing plate which has undergone image exposure is subjected to developing processing by being immersed in a developing solution, said method comprising:

providing a pair of conveying rollers for conveying the printing plate immersed in the developing solution configured to rotate in a state in which one of the rollers is partially immersed in the developing solution;

setting an amount of time that the pair of conveying rollers is driven to rotate in accordance with an amount of time that the pair of conveying rollers is in a stopped state;

measuring the amount of time that the pair of conveying rollers is in a stopped state;

at the time at which operation of the apparatus is started, determining, based on said setting, an amount of time that the pair of conveying rollers is driven to rotate, which amount of time corresponds to the measured amount of time; and prior to start-up of developing processing, driving the rotation of the pair of conveying rollers for a period of the determined amount of time.

16. The method of claim 15, further comprising the step of detecting carbon dioxide concentration, wherein said step of setting the amount of time that the pair of conveying rollers is driven to rotate comprises setting the driving time of the pair of conveying rollers based on the detected concentration of carbon dioxide and the measured amount of time.

17. The method of claim 15, wherein the driving time of the pair of conveying rollers is set so as to increase as the amount of time that the pair of conveying rollers is in a stopped state becomes greater.

18. The method of claim 15, wherein the driving time of the pair of conveying rollers is set so as to increase as a concentration of carbon dioxide in an environment in which the apparatus is installed becomes higher.

* * * * *